United States Patent
Lee et al.

(10) Patent No.: US 8,338,223 B2
(45) Date of Patent: Dec. 25, 2012

(54) FABRICATION METHOD FOR ORGANIC ELECTRONIC DEVICE AND ORGANIC ELECTRONIC DEVICE FABRICATED BY THE SAME METHOD

(75) Inventors: Jung-Hyoung Lee, Daejeon Metropolitan (KR); Jung-Bum Kim, Daejeon Metropolitan (KR)

(73) Assignee: LG Chem, Ltd., Seoul (KR)

( * ) Notice: Subject to any disclaimer, the term of this patent is extended or adjusted under 35 U.S.C. 154(b) by 592 days.

(21) Appl. No.: 12/227,144

(22) PCT Filed: May 10, 2007

(86) PCT No.: PCT/KR2007/002315
§ 371 (c)(1),
(2), (4) Date: Nov. 7, 2008

(87) PCT Pub. No.: WO2007/129874
PCT Pub. Date: Nov. 15, 2007

(65) Prior Publication Data
US 2009/0108254 A1    Apr. 30, 2009

(30) Foreign Application Priority Data
May 10, 2006    (KR) .................. 10-2006-0041872

(51) Int. Cl.
*H01L 51/40*    (2006.01)
(52) U.S. Cl. ...... 438/99; 438/22; 257/40; 257/E51.001; 257/E51.018
(58) Field of Classification Search ........... 257/E51.018, 257/40, E51.001; 438/22, 99
See application file for complete search history.

(56) References Cited

U.S. PATENT DOCUMENTS

| | | | |
|---|---|---|---|
| 4,736,229 A | | 4/1988 | Holmberg et al. |
| 6,016,033 A | * | 1/2000 | Jones et al. .................. 313/506 |
| 6,255,774 B1 | * | 7/2001 | Pichler ........................ 313/504 |
| 6,946,319 B2 | * | 9/2005 | Stegamat et al. ............. 438/104 |
| 2003/0022438 A1 | * | 1/2003 | Callaway et al. ............. 438/252 |
| 2004/0189186 A1 | | 9/2004 | Mori et al. |
| 2004/0241972 A1 | | 12/2004 | Stegamat et al. |

FOREIGN PATENT DOCUMENTS

| | | |
|---|---|---|
| EP | 1980141 A1 | 10/2008 |
| JP | 11026169 A | 1/1999 |
| KR | 20010014915 A | 2/2001 |
| KR | 1020070075651 A | 7/2007 |
| WO | WO 93/26139 | 12/1993 |

* cited by examiner

*Primary Examiner* — N Drew Richards
*Assistant Examiner* — Yu-Hsi D Sun
(74) *Attorney, Agent, or Firm* — McKenna Long & Aldridge LLP

(57) ABSTRACT

The present invention provides a fabrication method for an organic electronic device comprising a step of stacking sequentially a first electrode made of a metal, one or more organic material layers, and a second electrode on a substrate, wherein the method comprises the steps of: 1) forming a layer on the first electrode using a metal having a higher oxidation rate than the first electrode before forming the organic material layer, 2) treating the layer formed using a metal having a higher oxidation rate than the first electrode with oxygen plasma to form a metal oxide layer, and 3) treating the metal oxide layer with inert gas plasma to remove a native oxide layer on the first electrode, and an organic electronic device fabricated by the same method.

13 Claims, 7 Drawing Sheets

ns as known
FABRICATION METHOD FOR ORGANIC ELECTRONIC DEVICE AND ORGANIC ELECTRONIC DEVICE FABRICATED BY THE SAME METHOD This application is a 371 national stage entry of International Application No. PCT/KR2007/002315, filed on May 10, 2007 that claims priority to Korean Patent Application No. 10-2006-0041872, filed on May 10, 2006, both of which are hereby incorporated by reference in their entirety.

TECHNICAL FIELD

The present invention relates to a fabrication method for an organic electronic device, and an organic electronic device fabricated by the same method. More particularly, the present invention relates to a fabrication method for an organic electronic device capable of improving the electron or hole injection efficiency, and the electron or hole extracting efficiency, and the properties such as a life time by removing a native oxide layer, which is provided on the surface of an electrode made of a metal during the fabrication of the organic electronic device, and an organic electronic device fabricated using the same method.

This application claims priority from Korean Patent Application No. 10-2006-0041872 filed on May 10, 2006 in the Korean Intellectual Property Office, the disclosure of which is incorporated herein by reference in its entirety.

BACKGROUND ART

The organic electronic device refers to a device which requires charge exchange between an electrode and an organic material using holes and electrons. The organic electronic device can be largely classified into two types according to its operation principle as follows. One type is an electronic device having a configuration in which an exciton is formed in an organic material layer by photons flown from an external light source into the device and the exciton is separated into an electron and a hole, the formed electron and hole are transported to a different electrode, respectively and used as a current source (voltage source), and the other type is an electronic device having a configuration in which a hole and/or electron are/is injected into an organic material semiconductor forming an interface with an electrode by applying a voltage or current to two or more electrodes to allow the device to operate by means of the injected electron and hole.

Examples of the organic electronic device include an organic light emitting device, an organic solar cell, and an organic thin film transistor, which all require a hole injecting, hole extracting or hole transporting material, an electron injecting, electron extracting or electron transporting material, or a light emitting material for driving the device.

Hereinafter, the organic light emitting device will be mainly and specifically described, but in the above-mentioned organic electronic devices, the hole injecting, hole extracting or hole transporting material, the electron injecting, electron extracting or electron transporting material, or the light emitting material functions according to a similar principle.

In general, the term "organic light emission" means that electric energy is converted to light energy by using an organic material. The organic light emitting device (OLED) by the organic light emission has a structure usually comprising an anode, a cathode and an organic material layer interposed therebetween. Herein, the organic material layer may be mostly formed in a multilayer structure comprising layers of different materials, for example, the hole injecting layer, the hole transporting layer, the light emitting layer, the electron transporting layer, the electron injecting layer and the like, in order to improve efficiency and stability of the organic light emitting device. In the organic light emitting device having such a structure, when a voltage is applied between two electrodes, holes from the anode and electrons from a cathode are injected into the organic material layer, the holes and the electrons injected are combined together to form excitons. Further, when the excitons drop to a ground state, lights are emitted. Such the organic light emitting device is known to have characteristics such as self-luminescence, high brightness, high efficiency, low drive voltage, wide viewing angle, high contrast and high-speed response.

Various types of organic light emitting devices are known in the related art and they may be used for different applications. Examples of an organic light emitting device include a top light emitting OLED, a bottom light emitting OLED, and a dual-sided light emitting OLED.

If bottom light emitting OLEDs are used in active matrix displays, thin film transistors (TFT) are provided in front of the source of light emission, thereby reducing the ratio of the effective display area (aperture ratio). This problem is significant in the case when sophisticated displays having many TFTs are manufactured. With respect to a bottom light emitting OLED having an aperture ratio of less than 40%, an estimated aperture ratio of a WXGA type display that includes a TFT for 14" grade is less than 20%. Such small aperture ratio negatively affects the driving power consumption and life-time of the OLED.

The above-mentioned problem can be prevented by using a top light emitting OLED. In a top light emitting OLED, an electrode that is not in contact with a lower substrate, that is, an upper electrode, is substantially transparent in a visible ray region. A transparent electrode that is used to form the upper electrode of the top light emitting OLED is formed of a conductive oxide, such as IZO (indium zinc oxide) or ITO (indium tin oxide). However, an electrode that is in contact with the substrate is typically made of metal. Similar to the top light emitting OLED, the dual-sided light emitting OLED includes a transparent upper electrode.

When fabricating the top light emitting OLED, after a metal electrode is deposited on a substrate, an undesirable native oxide layer is formed on the surface of the metal electrode. In detail, when the metal electrode is patterned by using photolithography and etching processes during the fabrication of an organic light emitting device, the metal electrode is exposed to moisture and oxygen, causing the native oxide layer to be formed on the metal electrode.

The native oxide layer reduces properties of the metal electrode, that is, inhibits the electron injecting or the hole injecting, thus reducing efficiency and luminance of the organic light emitting device.

One process to prevent the native oxide layer from being formed on the metal electrode is to form an organic material layer on the deposited metal electrode in situ. During the process, since the metal electrode is not exposed to air, the oxide layer is not formed on the surface of the metal electrode. However, it is costly and difficult to perform the process under vacuum. A raw material supplier sometimes supplies a substrate, on the surface of which a metal electrode is layered, while the substrate is exposed to air before an organic material is deposited.

Therefore, there is a need to develop an organic light emitting device having improved electron or hole injecting properties, even though the native oxide layer is provided on the metal electrode, and a method of fabricating the same. There is also the same need to develop the above mentioned organic electronic device.

DISCLOSURE

Technical Problem

Therefore, it is an object of the present invention to provide a fabrication method for an organic electronic device by removing a native oxide layer provided on a metal electrode during the fabrication of the organic electronic device, in which properties of a metal electrode such as electron or hole injection and extraction are improved to improve properties of an organic electronic device such as increased efficiency, lower operating voltage, increased life-time, and higher stability, and an organic electronic device fabricated by the same method.

Advantageous Effects

In the present invention, upon fabricating an organic electronic device, a layer is formed on an electrode made of a metal using a metal having a higher oxidation rate than the electrode and then treated with plasma, effectively to remove a native oxide layer formed on the metal electrode, thereby improving electron or hole injecting and extracting property of the electrode to improve the properties such as electron injecting efficiency, low driving voltage and life-time.

BEST MODE

The present invention provides a method of fabricating the organic electronic device by sequentially stacking a first electrode made of a metal, one or more organic material layers, and a second electrode on a substrate, wherein the method comprises the steps of:

1) forming a layer on the first electrode using a metal having a higher oxidation rate than the first electrode before forming the organic material layer, 2) treating the layer formed using a metal having a higher oxidation rate than the first electrode with oxygen plasma to form a metal oxide layer, and 3) treating the metal oxide layer with inert gas plasma to remove a native oxide layer on the first electrode.

Further, the present invention provides an organic electronic device having a configuration of stacking a first electrode made of a metal, one or more organic material layers, and a second electrode sequentially, in which after forming the first electrode and before forming the organic material layer, a layer is formed using a metal having a higher oxidation rate than the first electrode, and the formed layer is sequentially treated with oxygen plasma and inert gas plasma to remove a native oxide layer on the first electrode.

Hereinafter, the present invention will be described in detail.

The method of fabricating an organic electronic device according to the invention comprises a step of stacking sequentially a first electrode made of a metal, one or more organic material layers, and a second electrode on a substrate, wherein the method further comprises the steps of: forming a layer on the first electrode using a metal having a higher oxidation rate than the first electrode before forming the organic material layer, and treating the layer with plasma. Herein, in the step of forming a layer on the first electrode using a metal having a higher oxidation rate than the first electrode, the material forming the layer is a metal itself having a higher oxidation rate than the first electrode, regardless of a change in the state of the layer due to an oxidation-reduction reaction even after its forming.

Upon fabricating the organic electronic device, a first electrode can be exposed to air during patterning process, resulting in a native oxide layer, for example, aluminum oxide film ($Al_2O_3$) layer on its surface. The native oxide layer prevents the electron or hole injecting and extracting properties of the first electrode. Consequently, it becomes difficult to operate the organic electronic device.

However, in the present invention, a layer formed on the first electrode using a metal having a higher oxidation rate than the first electrode before forming the organic material layer can be treated with plasma, in order to remove the native oxide layer formed on the first electrode in the production process of a device. It will be more specifically described as follows.

In the invention, the "oxidation rate" means the degree of increase in the oxygen content after reacting with oxygen, relative to that before reacting with oxygen. In the case where a layer is formed on the first electrode using a metal having a higher oxidation rate than the first electrode, as described above, the layer is substantially formed on a native oxide layer formed on the first electrode. At this time, in the interface between the native oxide layer and the layer formed on the native oxide layer, an oxidation-reduction reaction is occurred as following:

[Reaction Formula 1]

wherein M is the type of metal used for forming a first electrode, R is the type of metal used for forming a layer on the first electrode, which is the metal having a higher oxidation rate than the metal used for forming the layer on the first electrode, and x and y are each a molar ratio.

That is, if a layer is formed on a native oxide layer on the first electrode using a metal having a higher oxidation rate than the first electrode, the native oxide layer reacts with the metal having a higher oxidation rate than the metal forming the first electrode. According to the reaction, a metal layer is newly formed, instead of a native oxide layer associated with the first electrode formed on the first electrode, and the metal oxide layer is formed of a metal having a higher oxidation rate than the first electrode thereon, instead of a metal layer having a higher oxidation rate than the first electrode.

For example, in the case of the organic light emitting device having a reverse structure, in which the first electrode is a cathode comprising Al, a native oxide layer formed on the first electrode is aluminum oxide ($Al_2O_3$). A thin film is deposited on the aluminum oxide layer using Ca. At this time, the thin film formed using Ca is preferably 1 to 10 nm. The Ca reacts with $Al_2O_3$ as follows:

$$Al_2O_3 + Ca \rightarrow 2Al + 3CaO \quad \text{[Reaction Formula 2]}$$

The two layers are newly formed by the reaction between the two materials, thereby improving an electron injecting property of an organic light emitting device.

According to the above principles, in the present invention, a native oxide layer on a first electrode made of a metal is removed to improve the electron injecting and extracting property, or the hole injecting and extracting property of the first electrode made of a metal, while not generating the current leakage from the side. Therefore, the organic electronic device according to the invention has excellent electron or hole injecting efficiency, and electron or hole extracting efficiency, as well as an excellent light emitting property, life-time characteristics, and the like.

It is preferable that a metal having a higher oxidation rate than the first electrode has, but not limited thereto, an oxide formation energy ($\Delta_f H°$), which is no less than the MgO formation energy, −635.09 kJ/mol.

Examples of the metal having a higher oxidation rate than the first electrode include alkali metals, alkaline earth metals, and a mixture thereof, in particular, Ca, Mg, Ca/Ag, and Mg/Ag. Since Li is unstable in air, it is difficult to deposit. However, in the case of using a method to permit stable deposition of Li, Li can be used.

With reference to Table 1 showing an example of thermodynamic data of alkali metal oxide and alkaline earth metal oxide, the alkali metals, the alkaline earth metals, or a mixture thereof can prevent the formation of a native oxide layer by taking oxygen on the surface of a first electrode formed of the metal due to its strong oxidizing power, as well as reduce or remove the native oxide layer by reacting with the native oxide layer already formed.

TABLE 1

| Material (phase) | $\Delta_f H°$ (kJ/mol) | S° (J/mol*K) |
|---|---|---|
| MgO (s) | −635.09 | 26.85 |
| CaO (s) | −601.24 | 38.19 |
| SrO (s) | −592.04 | 55.42 |
| BaO (s) | −548.10 | 72.05 |
| $Li_2O$ (s) | −598.73 | 37.85 |
| $Na_2O$ (s) | −417.98 | 75.04 |
| $K_2O$ (s) | −363.17 | 94.03 |
| $Cs_2O$ (s) | −92.05 | 318.08 |

A layer formed by using a metal having a higher oxidation rate than the first electrode can be formed by using a method such as a thermal evaporation, a sputtering, an e-beam evaporation, an ion beam evaporation, but are not limited thereto. For the specific example, a layer formed by using a metal having a higher oxidation rate than the first electrode can be formed by a vacuum thermal evaporation at about $10^{-7}$ torr and a temperature in the range of 600° C. to 900° C. for about 10 to 20 seconds. But, in this case, the electrode on which the metal is deposited maintains preferably at normal temperature. Further, as described above, after forming a layer using a metal having a higher oxidation rate than the first electrode, even if the layer changes to be an oxide layer, the material forming the layer has to be the metal itself having a higher oxidation rate than the first electrode. If the layer is formed by using a metal oxide, the effects according to the above principles cannot be obtained.

The layer formed by using a metal having a higher oxidation rate than the first electrode can include at least one sub-layer.

The layer formed by using a metal having a higher oxidation rate than the first electrode is formed in a thin thickness, preferably 1 to 10 nm. In the above range, a native oxide layer, which prevents an electron or hole injection and extraction, can be effectively reduced or removed. Like this, a metal having a higher oxidation rate than the first electrode forming a layer with a thickness of several nanometers may react partially or entirely with a native oxide layer on the first electrode formed of the metal, or may form an oxide by reacting with the surrounding air or moisture.

According to the step (2), the layer formed on the native oxide layer of the first electrode by using a metal having a higher oxidation rate than the first electrode is treated with oxygen plasma to form a metal oxide layer. Such oxygen plasma treatment promotes the reaction of the native oxide layer with a metal having a higher oxidation rate than the first electrode to lower the binding energy of the native oxide layer. Thus, the native oxide layer changes to be the form of the metal oxide layer (for example, aluminum calcium oxide ($AlCaO_x$)) having lower binding energy than the known oxide (for example, aluminum oxide ($Al_2O_3$)). The condition of the oxygen plasma treatment is preferably an RF power of 60 to 100 W, an oxygen flow rate of 20 to 50 sccm (Standard Cubic Centimeter per Minute), a pressure of 10 to 20 mtorr, and a time of 30 to 100 seconds.

According to the step (3), the oxide layer on the first electrode is treated by plasma etching with an inert gas, preferably an inert gas with higher ion mass, using the effect of ion bombardment. Subsequently, the oxide layer can be easily separated to remove completely. In the case of using dry etching instead of ion bombardment etching, the oxide layer is not removed to remain.

As the examples of the inert gas having high ion mass, argon (Ar), krypton (Kr), xenon (Xe), and radon (Rn) (Ar<Kr<Xe<Rn) are preferable and argon is more preferable. The condition of the inert gas plasma treatment is preferably an RF power of 300 to 600 W, an inert gas flow rate of 5 to 20 sccm (Standard Cubic Centimeter per Minute), a pressure of 5 to 20 mtorr, and a time of 200 to 500 seconds.

That is, in the method of removing the native oxide layer according to the present invention, the reaction of the native oxide layer on the first electrode of the organic electronic device with a metal having a higher oxidation rate than the first electrode is promoted so as to lower the binding energy of the native oxide layer by oxygen plasma treatment, and plasma etching is performed using an inert gas with higher ion mass by the effect of ion bombardment to separate the oxide layer easily, thereby effectively removing the native oxide layer on the first electrode of the organic light emitting device.

A metal having a higher oxidation rate than the first electrode functions to change an energy level of the surface of the first electrode, thereby making an electron or hole injection and extraction easy by tunneling.

In general, it is known that the current leakage between the adjacent pixels in an organic electronic device is not preferable. According to one embodiment of the invention, a layer formed by using a metal having a higher oxidation rate than the first electrode is formed only on the selective region of the first electrode using a shadow mask, the layer connected to a pixel not to connect with the adjacent pixels, thereby avoiding the current leakage from the side.

In an active matrix organic electronic device, pixels can be separated to the side by the insulation. According to the invention, as described above, in the case where a layer is formed only on the selective region of the first electrode using a shadow mask, the layer is not extended over the side insulation between the adjacent pixels, thereby avoiding the current leakage from the side.

The organic electronic device according to the invention may be fabricated by a known method in the related art, with a first electrode, one or more organic material layers and a second electrode using the known materials, except that a layer formed by using a metal having a higher oxidation rate than a first electrode is placed between the first electrode and an organic material layer.

The first electrode may be formed of at least one metal layer. Examples of the metal used for forming the first electrode include aluminum, molybdenum, chromium, magnesium, calcium, sodium, potassium, titanium, indium, yttrium, lithium, gadolinium, silver, tin, lead, and an alloy thereof, but are not limited thereto. Among them, an aluminum electrode with a relatively high reflectivity (>50%) is more preferable. The metal materials may be deposited on a substrate by a deposition method such as thermal evaporation or sputtering. And also, it may be formed to be an electrode by patterning by the known method in the related art, such as photolithography and etching.

Figure 11:
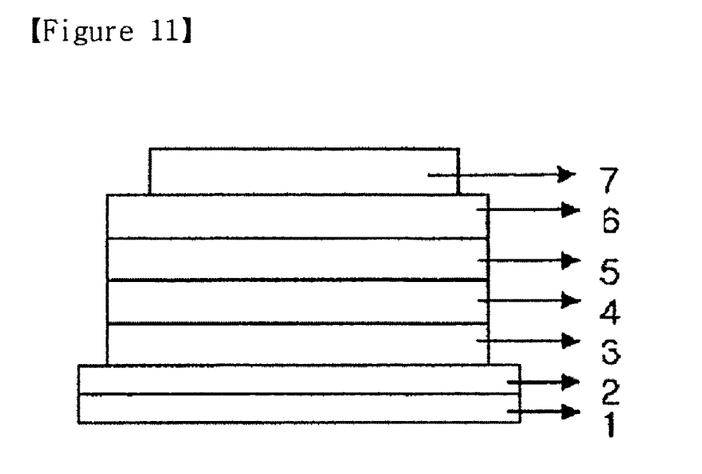
FIG. 11 is a view illustrating an example of an organic light emitting device comprising a substrate (1), an anode (2), a hole injecting layer (3), a hole transporting layer (4), a light emitting layer (5), an electron injecting layer (6), and a cathode (7) according to one embodiment of the present invention.

According to one embodiment of the invention, the organic electronic device may be an organic light emitting device having the structure of FIG. 11. That is, the anode (2) is formed on the substrate (1), the organic material layer such as the hole injecting layer (3), the hole transporting layer (4), the light emitting layer (5), or the electron transporting layer (6), is formed thereon, and then the cathode (7) can be deposited thereon.

The organic light emitting device may be applied to a top emission type, a bottom emission type, or a dual emission type, in particular, preferably a top emission type or a dual emission type.

The organic light emitting device may have a forward structure, in which a first electrode is an anode, and a second electrode is a cathode. At this time, the hole injecting property of the device can be improved by a layer formed between the first electrode and the organic material layer. Further, the organic light emitting device according to the invention may have a reverse structure, in which a first electrode is a cathode, and a second electrode is an anode. At this time, the electron injecting property of the device can be improved by a layer formed between the first electrode and the organic material layer.

The second electrode may be formed of transparent conductive materials. Likewise in the first electrode, the second electrode may be formed of at least one layer. In the case where the organic light emitting device according to the invention is a top emission type or a dual emission type, the second electrode has to transmit light, whereby transparent materials with a low reflectivity, for example, indium tin oxide (ITO) or indium zinc oxide (IZO), are generally used as the materials for the second electrode.

The organic material layer may be a monolayered structure or a multilayered structure comprising at least two layers, depending on the type of an organic material. That is, in the case of using an organic material having a hole and electron transporting property, as well as a light emitting property, the organic material layer may be formed in a monolayered structure. Meanwhile, at least two organic material layers formed of an organic material having at least one property of a hole injecting, a hole transporting, a light emitting, an electron transporting, and an electron injecting property is deposited to produce a multilayered structure. The organic material layer may further comprise an electron injecting layer or a hole injecting layer, in addition to a light emitting layer. Among these layers, one layer may be formed on the layer formed by using a metal having a higher oxidation rate than the first electrode.

The organic material layers may be formed of an organic material including imidazole, oxazole and thiazole. The organic material layer may be formed by depositing an organic material with a metal having a low work function, such as Li, Cs, Na, Mg, Sc, Ca, K, Ce, Eu. Alkali metal fluoride may be effectively employable for the electron injecting layer. Lithium fluoride (LiF) is more preferable because of its excellent electron injecting property.

The organic material layer can be prepared using spin coating, dip coating, doctor blading, screen printing, ink jet printing, and heat transfer processes other than a deposit process.

As an example of a device having the reverse structure of the organic light emitting device according to the invention, a cathode is formed by depositing aluminum on a transparent glass substrate using sputtering or thermal evaporation. And then, a native oxide ($Al_2O_3$) layer is formed on the aluminum electrode during a photoresistor process and an etching process, whereby electron injecting efficiency is decreased. On the aluminum electrode on which the native oxide layer is formed, a metal having a higher oxidation rate than the first electrode, such as alkali metal, alkaline earth metal or a mixture thereof, is deposited by sputtering or thermal evaporation or the like, and then treated with oxygen plasma and inert gas plasma. An organic material layer, such as an electron injecting layer, an electron transporting layer, a light emitting layer, a hole transporting layer, and a hole injecting layer, is formed thereon. A transparent anode material, in addition to IZO (Indium Zinc Oxide) used as the second electrode, is deposited thereon to produce an organic light emitting device. Like this, an organic light emitting device can be fabricated in a reverse structure (inverted structure; top emission), in which on a substrate, a cathode, an organic material layer and an anode are staked in this order. Moreover, an organic light emitting device can be also fabricated in a forward structure, in which on a substrate, an anode, an organic material layer and a cathode are staked in this order.

Figure 12:
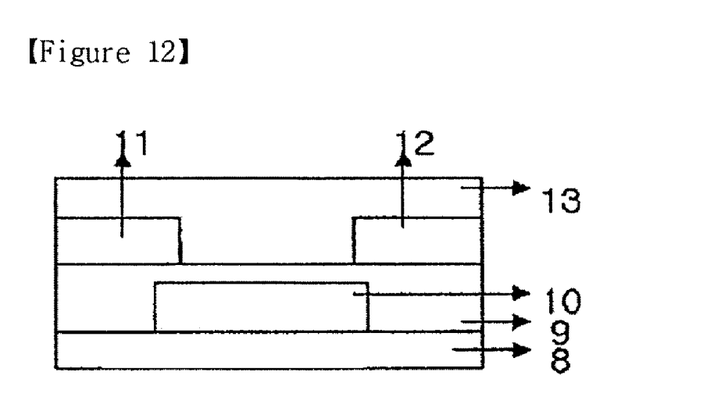
FIGS. 12 and 13 are views illustrating an example of an organic thin film transistor comprising a substrate (8), an insulating layer (9), a gate electrode (10), a source electrode (11), a drain electrode (12), and an organic material layer (13) according to one embodiment of the present invention.
Figure 13:
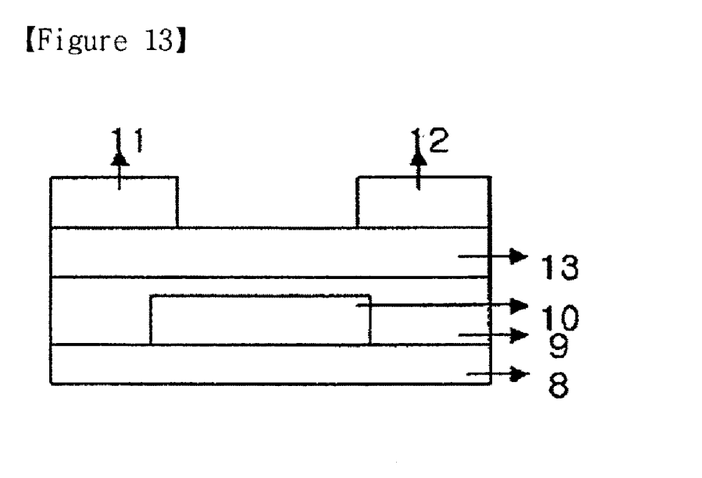

In the case where the organic electronic device according to the present invention is an organic thin film transistor, its structure may be a structure of FIG. 12 or FIG. 13. That is, the structure may a structure comprising an insulating layer (9), a gate electrode (10), a source electrode (11), a drain electrode (12), and an organic material layer (13).

Figure 14:
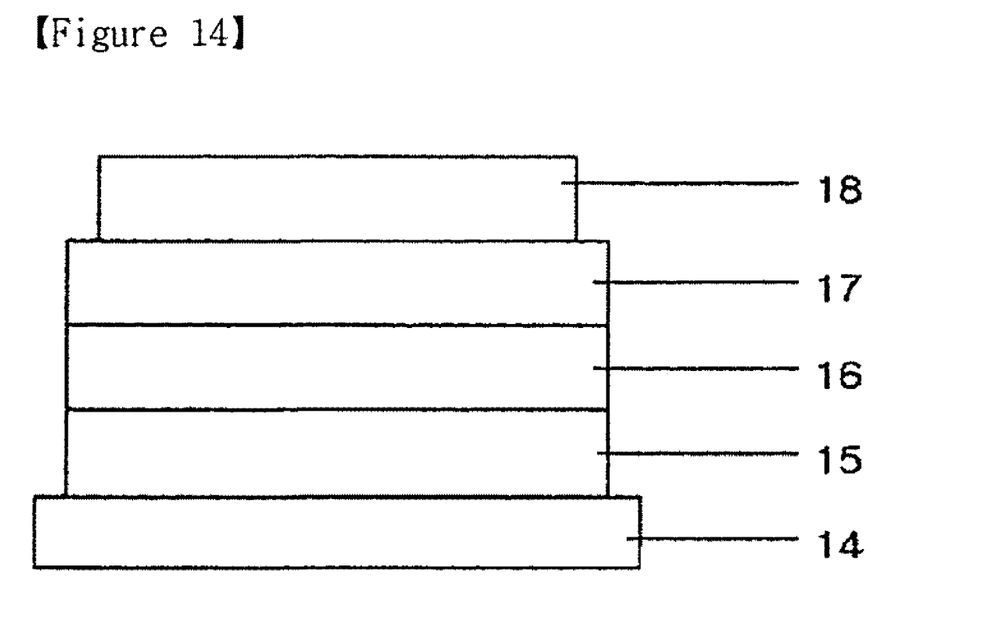
FIG. 14 is a view illustrating an example of an organic solar cell comprising a substrate (14), an anode (15), an electron donor layer (16), an electron acceptor layer (17), and a cathode (18) according to one embodiment of the present invention.

In the case where the organic electronic device according to the present invention is an organic solar cell, its structure may be a structure of FIG. 14. That is, the structure may a structure which an anode (15), an electron donor layer (16), an electron acceptor layer (17), and cathode (18) are sequentially stacked.

In the organic electronic device according to the present invention, the native oxide on the first electrode of the substrate is effectively removed, whereby the final product does not contain the native oxide layer between the first electrode and the organic material layer. Accordingly, the organic electronic device according to the present invention has excellent electron or hole injecting and extracting property, and excellent properties of the device such as light emitting or life-time, as compared with the conventional organic electronic device.

[Mode for Invention]

Hereinbelow, an organic electronic device and a method of fabricating the same of the present invention will be described in detail with reference to the Examples. However, the Examples will be provided for the purpose of illustrating the present invention, and thus, the scope of the present invention is not limited thereto.

EXAMPLE 1

Fabrication of Organic Light Emitting Device Treated with Ca

On a glass substrate, an aluminum electrode layer was formed to a thickness of 150 nm by a photoresist and etching, and on the formed electrode layer, calcium (Ca) was coated by thermal vacuum deposition under $10^{-7}$ torr and inert gas ($N_2$ or Ar) atmosphere at 700° C. for 10 seconds to form a layer having a thicknesses of 2 nm. The deposited layer formed is treated with oxygen plasma with the following treatment condition.

A glow discharge plasma device (RF-5S, manufactured by Advanced energy), which is a capacitively-coupled model using Radio frequency (13.56 MHz) at a vacuum chamber of several tens mTorr, was used. That is, voltage of 80 W was applied between two parallel electrodes (space=3.5 cm). At first, under the plasma frequency of 13.56 MHz, the stable state of the oxygen plasma was maintained. In this state, the layer formed by calcium was oxidized under the conditions of a flow rate of 30 sccm (Standard Cubic Centimeter per Minute), a pressure of 14 mtorr, and a treatment time of 60 seconds.

The native oxide layer changed into a metal oxide layer (for example, aluminum calcium oxide ($Al_2CaO_4$)) having a lower binding energy than a known oxide (for example, aluminum oxide) by the oxygen plasma treatment.

The aluminum calcium oxide was performed with the argon plasma treatment. The condition of the argon plasma treatment is preferably an RF power of 500 W, an argon flow rate of 10 sccm (Standard Cubic Centimeter per Minute), a pressure of 10 mtorr, and a time of 300 seconds.

Subsequently, a LiF layone in the form ofer as an electron injecting material was formed on the layer to a thickness of 1.5 nm and an electron transporting layer (the following electron transporting material), a light emitting layer ($Alq_3$), a hole transporting layer (NPB; 4,4'-bis[N-(1-naphtyl)-N-phenylamino]biphenyl), and a hole injecting layer (the following hole injecting material (hexanitrile hexaazatriphenylene, HAT)) as an organic material layer can be sequentially stacked thereon in a thickness of 20 nm, 30 nm, 40 nm, and 50 nm, respectively. Then, a transparent IZO electrode as a hole injecting electrode is formed on the above organic material layer by sputtering to a thickness of 150 nm to fabricate an organic light emitting device.

[Electron transporting material]

[Hole injecting material]

EXAMPLE 2

Fabrication of Organic Light Emitting Device Treated with Mg

An organic light emitting device was fabricated in the same manner as in Example 1, except that a layer was formed with a thickness of 3.0 nm using magnesium (Mg) instead of Ca.

EXAMPLE 3

Fabrication of Organic Light Emitting Device Treated with Cs

An organic light emitting device was fabricated in the same manner as in Example 1, except that a layer was formed with a thickness of 3.0 nm using cesium (Cs) instead of Ca.

COMPARATIVE EXAMPLE 1

Fabrication of Organic Light Emitting Device without Electron Injecting Layer

An organic light emitting device was fabricated in the same manner as in Example 1, except that the deposited layer was formed using Ca on the aluminum electrode and then treated with oxygen plasma and argon plasma, without the electron injecting layer. The electron injecting property of the fabricated organic light emitting device was confirmed.

COMPARATIVE EXAMPLE 2

Fabrication of Organic Light Emitting Device not Removing Native Oxide Layer An organic light emitting device was fabricated in the same manner as in Example 1, except that the deposited layer was not formed using Ca on the aluminum electrode, the oxygen plasma treatment and argon plasma treatment were not performed, and the electron injecting layer was not inserted. The electron injecting property of the fabricated organic light emitting device was confirmed.

COMPARATIVE EXAMPLE 3

Fabrication of Organic Light Emitting Device Only Treated with Plasma

An organic light emitting device was fabricated in the same manner as in Example 1, except that the deposited layer was not formed using Ca on the aluminum electrode, and the oxygen plasma treatment and argon plasma treatment were performed.

COMPARATIVE EXAMPLE 4

Fabrication of Organic Light Emitting Device Only Treated with Oxygen Plasma An organic light emitting device was fabricated in the same manner as in Example 1, except that the deposited layer was not formed using Ca on the aluminum electrode, and oxygen plasma treatment was performed without treating with argon plasma.

COMPARATIVE EXAMPLE 5

Fabrication of Organic Light Emitting Device on Which Metal Oxide was Deposited An organic light emitting device was fabricated in the same manner as in Example 1, except that the deposited layer was not formed using Ca on the aluminum electrode, and MgO was directly deposited on the aluminum electrode to form a layer.

COMPARATIVE EXAMPLE 6

Fabrication of Organic Light Emitting Device in which Plasma Treatment is not Performed after Deposition of Alkali Metal An organic light emitting device was fabricated in the same manner as in Example 1, except that the deposited layer was formed using Ca on the aluminum electrode, and the oxygen and argon plasma treatment were not performed.

EXPERIMENTAL EXAMPLE

In order to compare whether the native oxide layers of the organic light emitting devices according to Examples 1 to 3 and Comparative Examples 1 to 6 were effectively removed or not, their electron injecting properties were confirmed. The results are shown in FIGS. 2 to 10.

Figure 1:
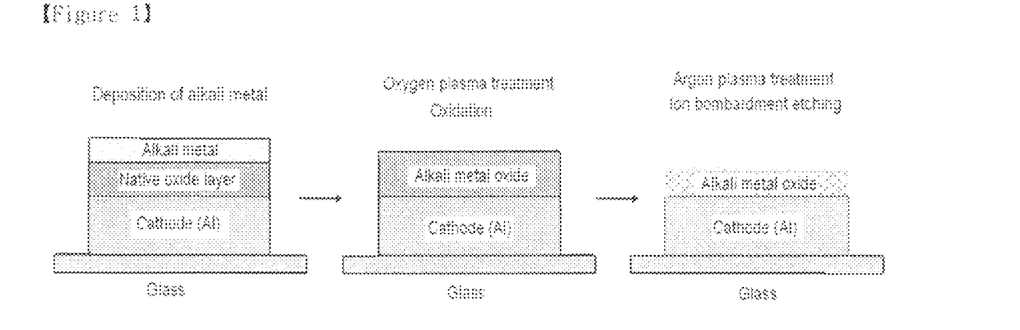
FIG. 1 is a view illustrating steps in a method for removing a native oxide layer on a electrode of an organic light emitting device by plasma treatment according to one embodiment of the present invention.
Figure 2:
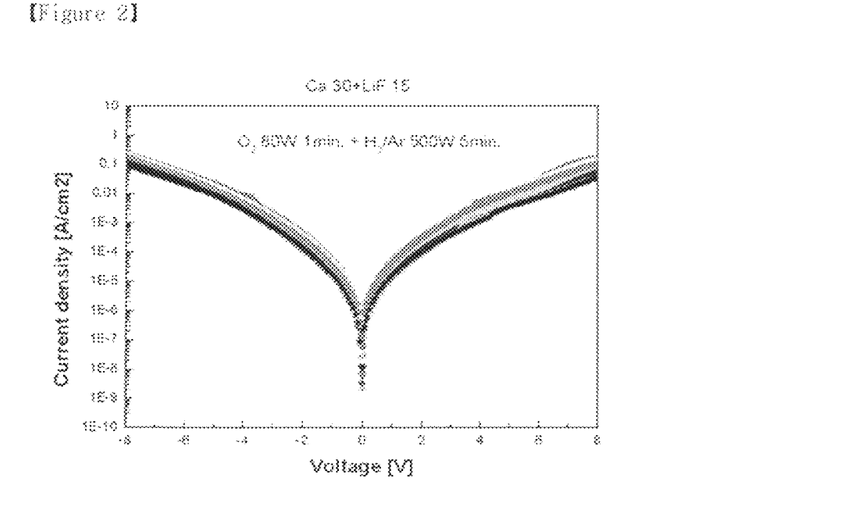
FIGS. 2 to 4 are views illustrating an electron injecting property of each organic light emitting device fabricated according to Examples 1 to 3.
Figure 3:
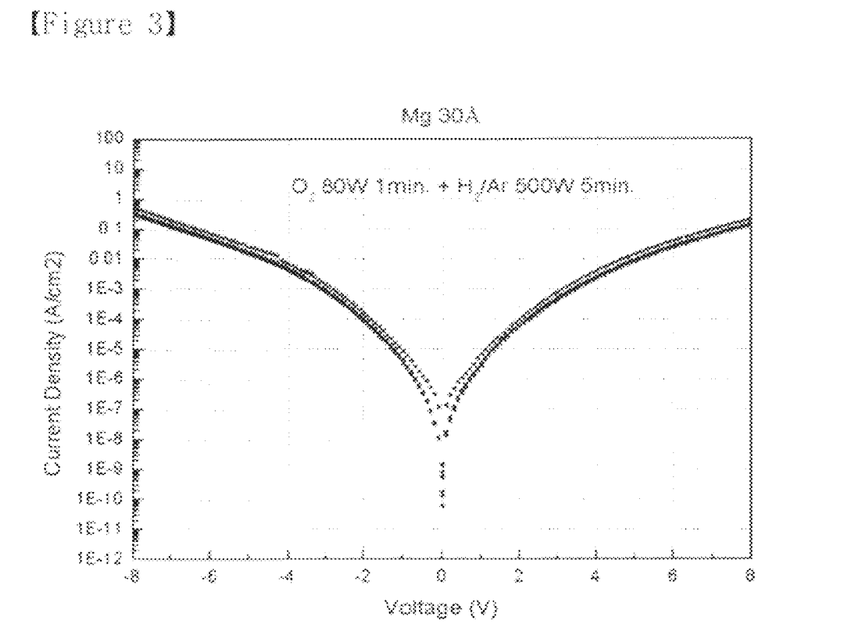
Figure 4:
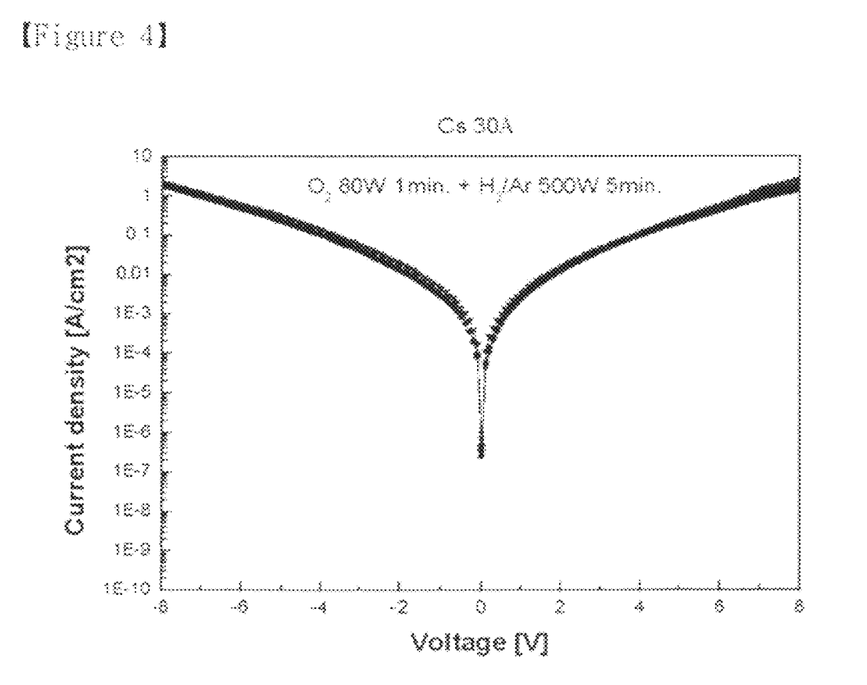
Figure 5:
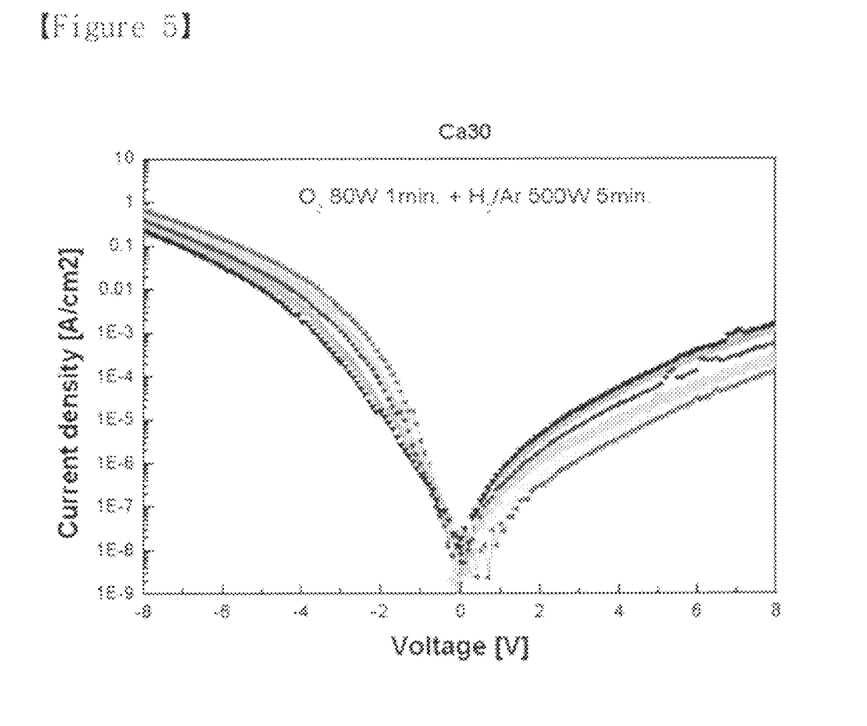
FIGS. 5 to 10 are views illustrating an electron injecting property of each organic light emitting device fabricated according to Comparative Examples 1 to 6.

As shown in FIGS. 2 and 5, in the case of Comparative Example 1, the electron injecting layer (LiF) is omitted. Therefore, the electron injecting efficiency of the organic light emitting device was found to be asymmetric. That is, upon treating as the above mentioned, it was found that the oxide layer was removed but the electron injecting effect is reduced.

Figure 6:
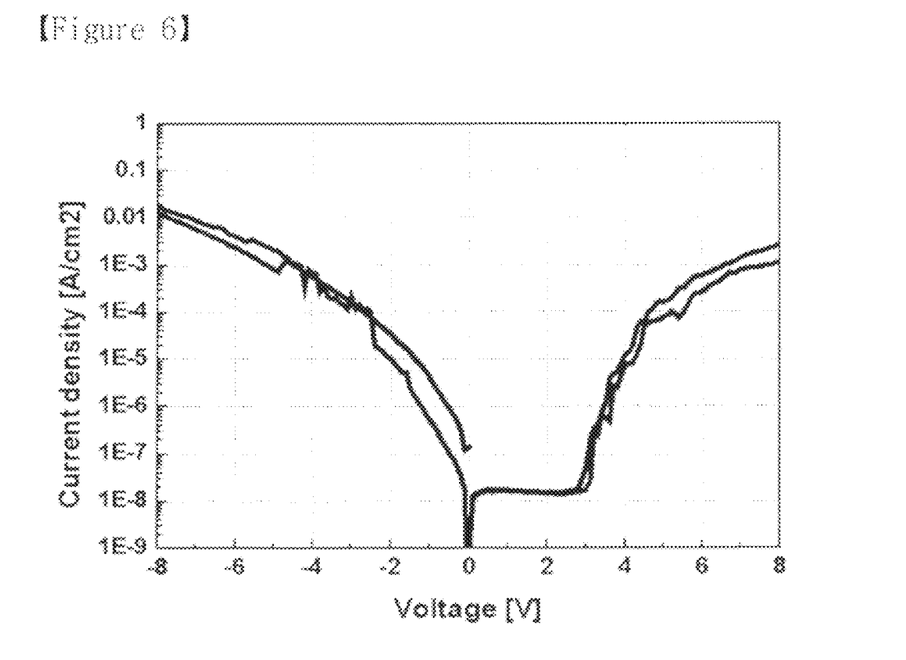

Further, as shown in FIG. 6, in the case of Comparative Example 2, in which the deposited layer was not formed and the oxygen plasma treatment and argon plasma treatment were not performed, the electron injecting efficiency was found to be asymmetric, thereby confirming that the electron injecting effect was significantly reduced.

Figure 7:
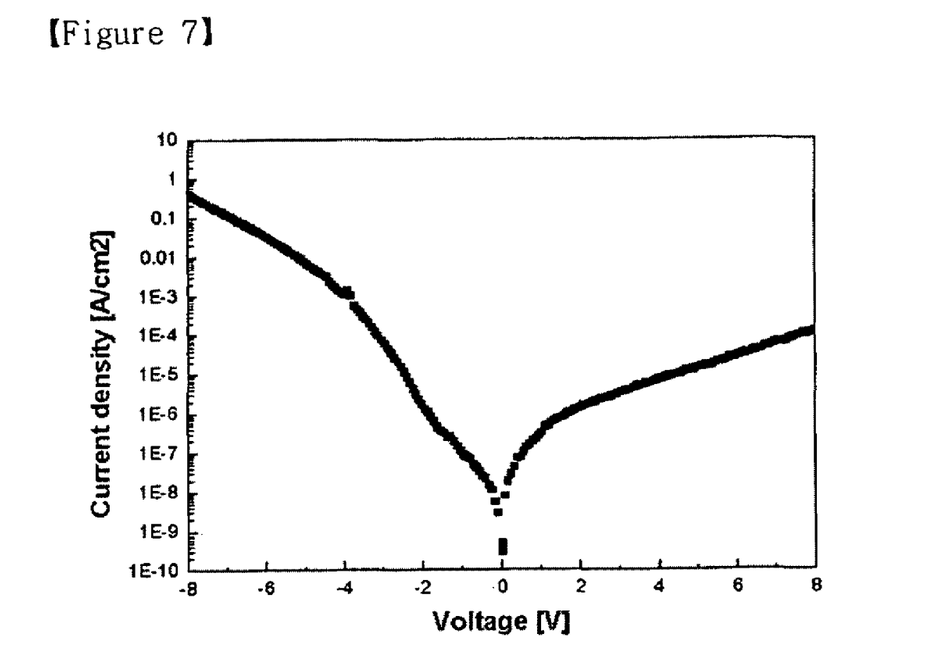
Figure 8:
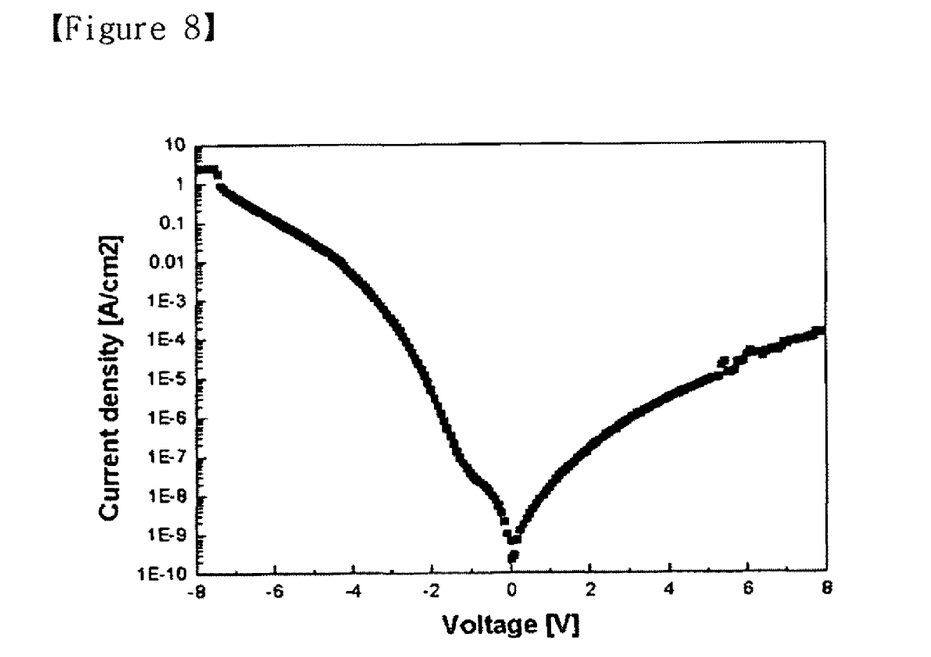

As shown in FIGS. 7 and 8, in the case of performing only the plasma treatment without forming the alkali metal oxide layer or alkaline earth metal oxide layer, the effect of removing the native oxide layer was found to be reduced.

Figure 9:
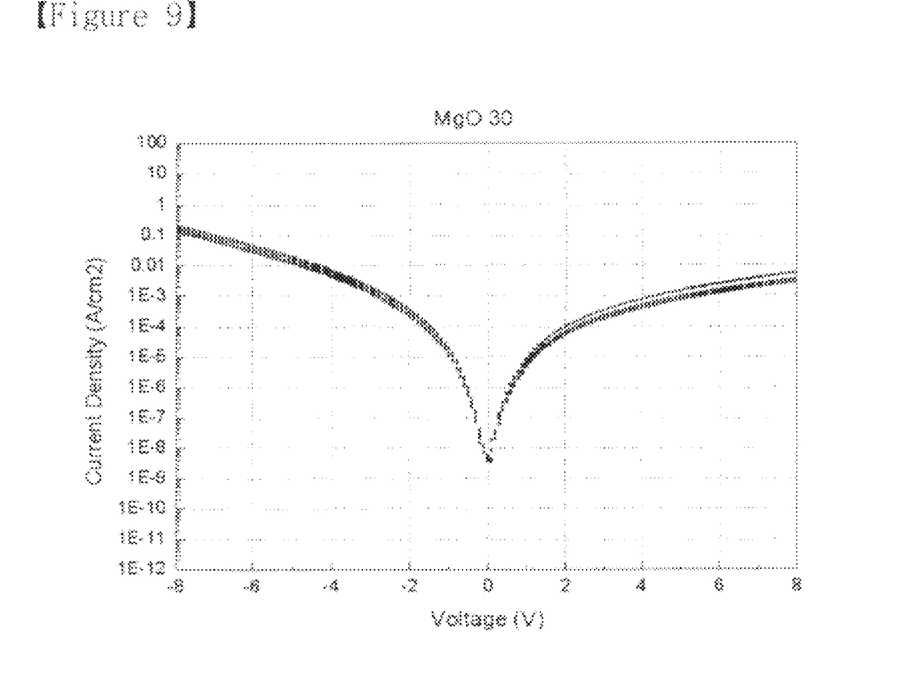

Further, as shown in FIG. 9, in the case of depositing the alkali metal or alkaline earth metal, the efficiency of removing the native oxide layer was found to be reduced, as compared to the case of depositing the alkali metal oxide or alkaline earth metal oxide.

Figure 10:
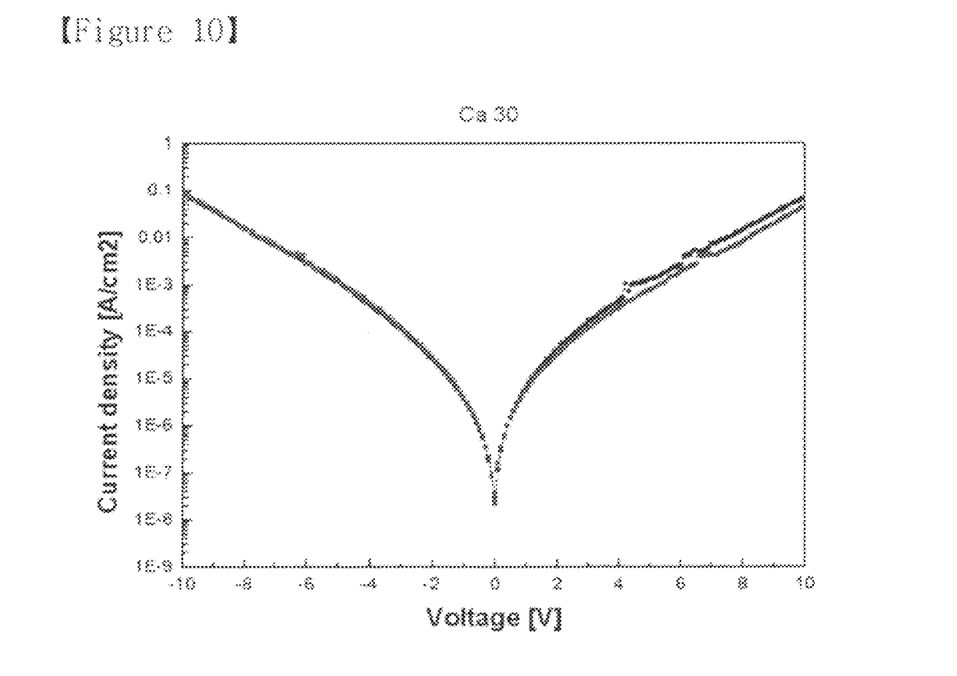

Further, as shown in FIG. 10, in the case of depositing only the alkali metal, electrons were found to be symmetrically injected in initial measurement data, but the ability of injecting electrons was found to be reduced over time.

The invention claimed is:

1. A method of fabricating an organic electronic device by sequentially stacking a first electrode made of a metal, one or more organic material layers, and a second electrode on a substrate, wherein the method comprises the steps of:
   1) forming a layer on a native oxide layer on the first electrode using a metal having a higher oxidation rate than the first electrode before forming the organic material layer,
   2) treating the layer formed using a metal having a higher oxidation rate than the first electrode with oxygen plasma to change the native oxide layer into a metal oxide layer, and
   3) treating the metal oxide layer with inert gas plasma to remove the metal oxide layer.

2. The method of fabricating the organic electronic device according to claim 1, wherein the first electrode is formed of a material selected from the group consisting of aluminum, molybdenum, chromium, magnesium, calcium, sodium, potassium, titanium, indium, yttrium, lithium, gadolinium, silver, tin, lead, and an alloy thereof.

3. The method of fabricating the organic electronic device according to claim 1, wherein the metal having a higher oxidation rate than the first electrode is selected from alkali metal, alkaline earth metal, and a mixture thereof.

4. The method of fabricating the organic electronic device according to claim 1, wherein the layer formed by using the metal having a higher oxidation rate than the first electrode is formed to a thickness of 1 to 10 nm.

5. The method of fabricating the organic electronic device according to claim 1, wherein the layer formed by using a metal having a higher oxidation rate than the first electrode is formed using a shadow mask.

6. The method of fabricating the organic electronic device according to claim 1, wherein the inert gas is argon (Ar), krypton (Kr), xenon (Xe) or radon (Rn).

7. The method of fabricating the organic electronic device according to claim 1, wherein the condition of the oxygen plasma treatment is an RF power of 60 to 100 W, an oxygen flow rate of 20 to 50 sccm, a pressure of 10 to 20 mtorr, and a time of 30 to 100 seconds.

8. The method of fabricating the organic electronic device according to claim 1, wherein the condition of the inert gas plasma treatment is an RF power of 300 to 600 W, an inert gas flow rate of 5 to 20 sccm, a pressure of 5 to 20 mtorr, and a time of 200 to 500 seconds.

9. The method of fabricating the organic electronic device according to claim 1, wherein the organic electronic device is an organic light emitting device.

10. The method of fabricating the organic electronic device according to claim 9, wherein the first electrode is an anode, and the second electrode is a cathode.

11. The method of fabricating the organic electronic device according to claim 9, wherein the first electrode is a cathode, and the second electrode is an anode.

12. The method of fabricating the organic electronic device according to claim 9, wherein among the organic material layers, a layer making contact with the layer formed by using a metal having a higher oxidation rate than the first electrode is an electron injecting layer or a hole injecting layer.

13. The method of fabricating the organic electronic device according to claim 9, wherein the organic light emitting device is of a top light emitting type, or of a dual light emitting type.

\* \* \* \* \*